US010712595B2

(12) United States Patent
Yang

(10) Patent No.: US 10,712,595 B2
(45) Date of Patent: Jul. 14, 2020

(54) FULL SCREEN MODULE AND SMARTPHONE

(71) Applicant: Wuhan China Star Optoelectronics Technology Co., Ltd., Wuhan (CN)

(72) Inventor: Sijie Yang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/313,003

(22) PCT Filed: Sep. 27, 2018

(86) PCT No.: PCT/CN2018/108057
§ 371 (c)(1),
(2) Date: Dec. 21, 2018

(87) PCT Pub. No.: WO2019/227808
PCT Pub. Date: Dec. 5, 2019

(65) Prior Publication Data
US 2019/0361280 A1    Nov. 28, 2019

(30) Foreign Application Priority Data

May 28, 2018   (CN) .......................... 2018 1 0525847

(51) Int. Cl.
*G02F 1/133*   (2006.01)
*H05K 1/18*    (2006.01)
(Continued)

(52) U.S. Cl.
CPC .... *G02F 1/13318* (2013.01); *G02F 1/133526* (2013.01); *G09G 3/2074* (2013.01);
(Continued)

(58) Field of Classification Search
CPC .......... G02F 1/13318; G02F 1/133526; G09G 3/02074; G09G 2300/0408; H04M 1/0266; H05K 1/189; H05K 2201/10128
See application file for complete search history.

(56) References Cited

U.S. PATENT DOCUMENTS 6,933,976 B1 * 8/2005 Suzuki .............. H01L 27/14621
257/240
10,290,257 B1 * 5/2019 Slobodin .......... H01L 27/14605
(Continued)

FOREIGN PATENT DOCUMENTS

CN            1435892 A     8/2003
CN          101387771 A     3/2009
(Continued)

*Primary Examiner* — Lixi C Simpson
(74) *Attorney, Agent, or Firm* — Leong C. Lei

(57) ABSTRACT

The present disclosure relates to a full screen module and a smartphone. The full screen module includes a display panel, a driving chip electrically connected to the display panel, a first flexible circuit board electrically connected to the driving chip, a photoreceptor panel configured on the display panel, and a second flexible circuit board electrically connected to the photoreceptor panel and the first flexible circuit board. The photoreceptor panel is configured to receive light signals, to transform the light signals into digital signals, and to transmit the digital signals to the driving chip. The driving chip is configured to transform the digital signals into data signals, and to drive the display panel to display images. The photoreceptor panel may replace the front camera module of the conventional smartphone. As such, the screen ration of the smartphone may be improved.

8 Claims, 5 Drawing Sheets

(51) Int. Cl.
*H04M 1/02* (2006.01)
*G02F 1/1335* (2006.01)
*G09G 3/20* (2006.01)

(52) U.S. Cl.
CPC .......... *H04M 1/0266* (2013.01); *H05K 1/189* (2013.01); *G09G 2300/0408* (2013.01); *H05K 2201/10128* (2013.01)

(56) References Cited

U.S. PATENT DOCUMENTS

| | | | |
|---|---|---|---|
| 2002/0030768 | A1 | 3/2002 | Wu |
| 2015/0281613 | A1* | 10/2015 | Vogelsang ......... H04N 5/35545 348/300 |
| 2017/0078513 | A1* | 3/2017 | Chang ................... H04N 5/335 |

FOREIGN PATENT DOCUMENTS

| | | |
|---|---|---|
| CN | 104570449 A | 4/2015 |
| CN | 106707576 A | 5/2017 |
| CN | 106950738 A | 7/2017 |
| CN | 107346152 A | 11/2017 |
| CN | 107728361 A | 2/2018 |
| CN | 207233359 U | 4/2018 |

\* cited by examiner

FULL SCREEN MODULE AND SMARTPHONE

FIELD OF THE INVENTION

The present disclosure relates to a display field, and more particularly to a full screen module and a smartphone.

BACKGROUND OF THE INVENTION

The thin film transistor (TFT) is the main driving element of liquid crystal displays (LCDs) and active matrix organic light-emitting diodes (AMOLEDs), and the TFT may directly affect the display performance of flat display devices.

The conventional LCDs are mostly the backlit LCDs, which may include a LCD panel and a backlight module. The operating principle of the LCD panels is to fill the liquid crystal molecules between the TFT array substrate and the color filter (CF), to conduct the pixel voltage and the common voltage respectively on the two substrates, and to control the rotating direction of the liquid crystal molecules by an electric field formed between the pixel voltage and the common voltage. As such, the light beams emitted from the backlight module may be refracted to generate the images.

The full-screen is referred to as a liquid crystal screen having ultra-high screen ratio. For example, the Notch screen of the Iphone X. The screen ratio of the Notch screen can reach 81.15%. However, the upper portion of the Notch screen include a special-shaped slot configured to accommodate a front lens. If a mobile phone adopting the Notch screen is used to display a full-screen video, the special-shaped slot may block a portion of the display screen, which may affect the aesthetics. In addition, when the mobile application developer develops an application interface for the Notch screen, the hidden status bar cannot be configured at the top of the Notch screen. Moreover, the manufacturing process and design of the Notch screen is difficult. With the development of the small-sized electronic displays, the demand of the narrow frame of the small-sized full screen displays has become even greater. The space for accommodating the front lens becomes even smaller due to the narrow frame design. The conventional full screen design cannot meet the requirements, and it is necessary to provide a new full-screen design.

SUMMARY OF THE INVENTION

The present disclosure relates to a full screen module for a smartphone, including a photoreceptor panel, which is able to replace a front camera module of a conventional smartphone. As such, a screen ratio may be improved.

The present disclosure relates to the smartphone. The photoreceptor panel of the full screen module is able to replace the front camera module of the conventional smartphone. As such, the screen ratio may be improved.

In one aspect, the present disclosure relates to a full screen module, including: a display panel; a driving chip being electrically connected to the display panel; a first flexible circuit board being electrically connected to the driving chip; a photoreceptor panel being configured on the display panel; and a second flexible circuit board being electrically connected to the photoreceptor panel and the first flexible circuit board; wherein the photoreceptor panel is configured to receive light signals, to transform the light signals into digital signals, and to transmit the digital signals to the driving chip; the driving chip is configured to transform the digital signals into data signals, and to drive the display panel to display images.

The full screen module further includes: a polarizer being configured between the display panel and the photoreceptor panel; and a protection cover being configured on the photoreceptor panel.

The photoreceptor panel includes a plurality of micro-lens units being arranged in an array and a gate driver on array (GOA) unit being electrically connected to the plurality of micro-lens units; the micro-lens unit is configured to receive the light signals, to transform the light signals into electrical analog signals, and to transmit the electrical analog signals to the GOA circuit; the GOA circuit is configured to receive the electrical analog signals, to transform the electrical analog signals into the digital signals, and to transmit the digital signals to the driving chip.

Each of the micro-lens units includes a substrate, a phototransistor, a plurality of electrodes, a light blocking film, a color filter, a planarization layer, and a micro-lens; the phototransistor is configured on the substrate, the electrodes are configured on the substrate and respectively connect to two ends of the phototransistor, the light blocking film is configured on the electrodes, and the phototransistor is exposed by the light blocking film, the color filter is configured on the phototransistor and the light blocking film, the planarization layer is configured on the color filter, the micro-lens is configured on the planarization layer, and the micro-lens corresponds to the phototransistor; the phototransistor is configured to transform the light signals into the electrical analog signals; the electrode is configured to transmit the electrical analog signals to the GOA circuit.

The GOA circuit includes an address decoder and an analog to digital (A/D) converter being electrically connected to the plurality of micro-lens units; the address decoder is configured to determine an address of the micro-lens unit where the electrical analog signals are transmitted, and to transmit the electrical analog signals to the A/D converter; the A/D converter is configured to transform the electrical analog signals into the digital signals.

The display panel includes a plurality of sub-pixels being arranged in an array, and each of the sub-pixels corresponds to one micro-lens unit; each of the sub-pixels includes an emitting area and a non-emitting area, and the plurality of micro-lens units are configured above the non-emitting area.

In another aspect, the present disclosure further relates to a smartphone, including: a motherboard and the full screen module being connected to the motherboard.

The motherboard includes a processor being electrically connected to the full screen module; the processor is configured to receive the digital signals outputted from the driving chip to provide image information to the display panel.

A maximum pixel value composed by a plurality of micro-lens units is the same with a resolution of the smartphone.

In view of the above, the full screen module of the present disclosure includes the display panel, the driving chip electrically connected to the display panel, the first flexible circuit board electrically connected to the driving chip, the photoreceptor panel configured on the display panel, and the second flexible circuit board electrically connected to the photoreceptor panel and the first flexible circuit board. The photoreceptor panel is configured to receive the light signals, to transform the light signals into the digital signals, and to transmit the digital signals to the driving chip. The driving chip is configured to transform the digital signals into the data signals, and to drive the display panel to display images. When the full screen module is adopted by the smartphone, the photoreceptor panel may replace the front camera module of the conventional smartphone, and there is no need to have the special-shaped slot for accommodating the front camera module as the conventional display panel. As such, the screen ration of the smartphone may be improved by adopting the full screen module of the present disclosure. The smartphone of the present disclosure may include the full screen module. The photoreceptor panel of the full screen module may be able to replace the front camera module of the conventional smartphone. As such, the screen ratio may be improved.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
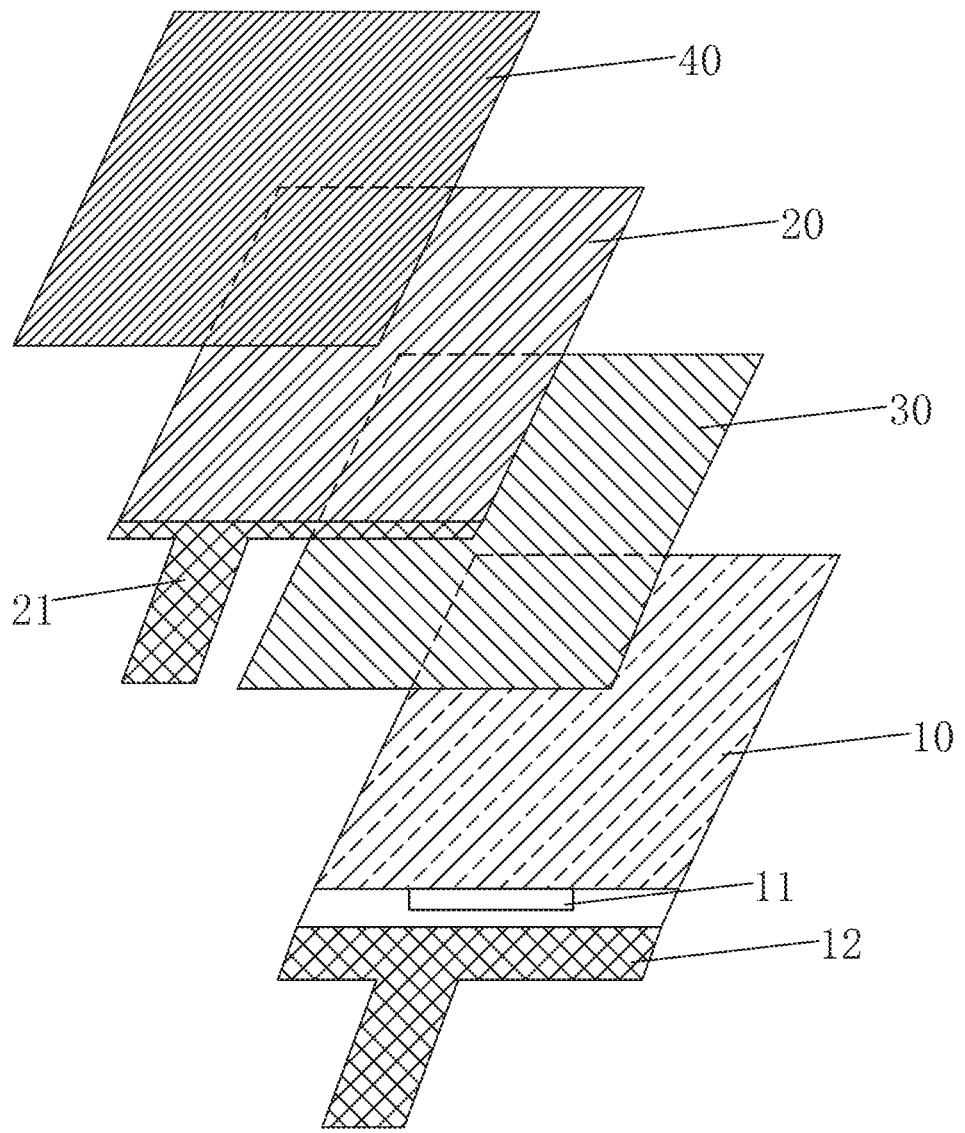
FIG. 1 is a diagram illustrating a full screen module in accordance with one embodiment of the present disclosure.

Referring to FIG. 1, a full screen module includes a display panel 10, a driving chip 11, a first flexible circuit board 12, a photoreceptor panel 20, and a second flexible circuit board 21. The driving chip 11 electrically connects to the display panel 10. The first flexible circuit board 12 electrically connects to the driving chip 11. The photoreceptor panel 20 is configured on the display panel 10. The second flexible circuit board 21 electrically connects to the photoreceptor panel 20 and the first flexible circuit board 12.

The photoreceptor panel 20 is configured to receive light signals, to transform the light signals into digital signals, and to transmit the digital signals to the driving chip 11.

The driving chip 11 is configured to transform the digital signals into data signals, and to drive the display panel 10 to display images.

It is noted that the photoreceptor panel 20 is configured on the display panel 10, and electrically connects to the driving chip 11. The photoreceptor panel 20 is configured to receive the light signals, to transform the light signals into the digital signals, and to transmit the digital signals to the driving chip 11. The driving chip 11 is configured to transform the digital signals into the data signals, and to drive the display panel 10 to display the images. For example, when the full screen module is adopted by a smartphone, and the smartphone is used for a selfie, the photoreceptor panel is configured to receive the light signals, to transform the light signals into the digital signals, and to transmit the digital signals to the driving chip 11. The driving chip 11 is configured to transform the digital signals into the data signals, and to drive the display panel 10 to display the images locating in a front of the smartphone. When the full screen module is adopted by the smartphone, the photoreceptor panel 20 may replace a front camera module of the conventional smartphone, and there is no need to have a special-shaped slot for accommodating the front camera module. As such, a screen ration may be configured to be nearly 100%.

Specifically, the full screen module further includes a polarizer 30 and a protection cover 40. The polarizer 30 is configured between the display panel 10 and the photoreceptor panel 20. The protection cover 40 is configured on the photoreceptor panel 20.

Figure 2:
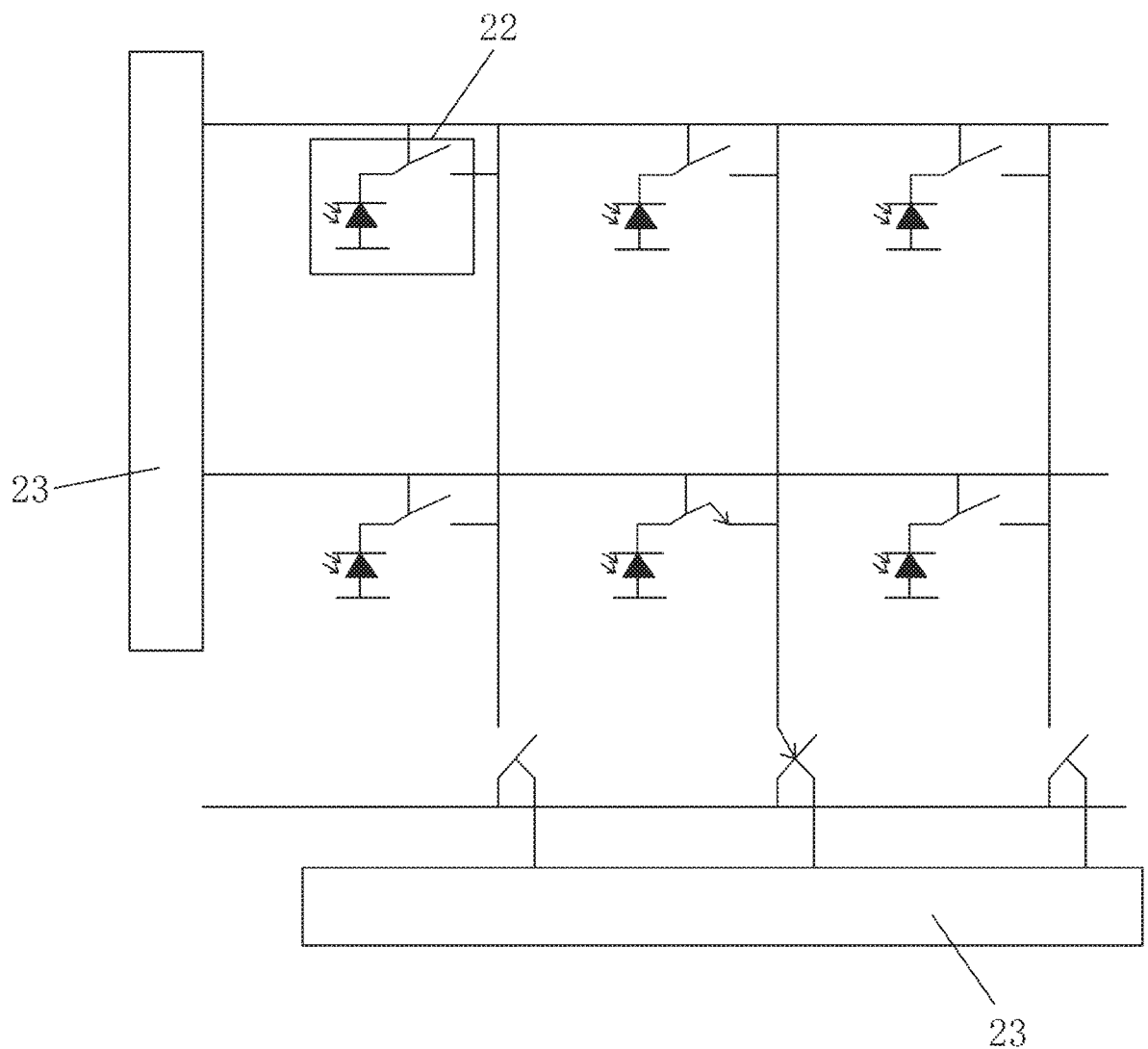
FIG. 2 is a schematic view of a photoreceptor panel of the full screen module in accordance with one embodiment of the present disclosure.

Specifically, referring to FIG. 2, the photoreceptor panel 20 includes a plurality of micro-lens units 22 arranged in an array and a gate driver on array (GOA) unit 23 electrically connected to the plurality of micro-lens units 22.

The micro-lens unit 22 is configured to receive the light signals, to transform the light signals into electrical analog signals, and to transmit the electrical analog signals to the GOA circuit 23.

The GOA circuit 23 is configured to receive the electrical analog signals, to transform the electrical analog signals into the digital signals, and to transmit the digital signals to the driving chip 11.

Figure 3:
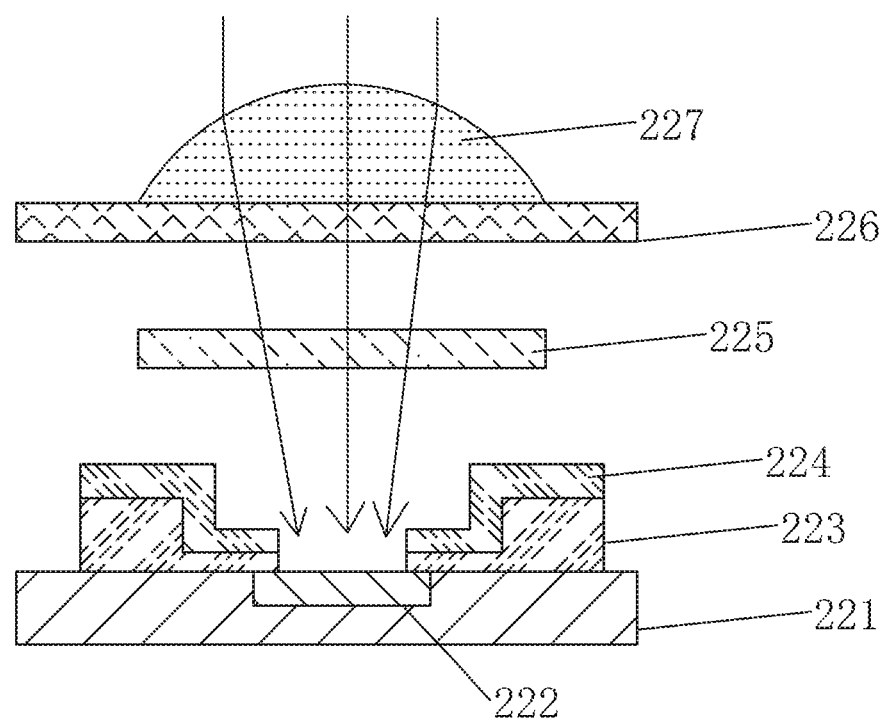
FIG. 3 is a schematic view illustrating a plurality of micro-lens units of the full screen module in accordance with one embodiment of the present disclosure.

Specifically, referring to FIG. 3, each of the micro-lens units 22 includes a substrate 221, a phototransistor 222, a plurality of electrodes 223, a light blocking film 224, a color filter 225, a planarization layer 226, and a micro-lens 227. The phototransistor 222 is configured on the substrate 221. The electrodes 223 are configured on the substrate 221 and respectively connect to two ends of the phototransistor 222. The light blocking film 224 is configured on the electrodes 223, and the phototransistor 222 is exposed by the light blocking film 224. The color filter 225 is configured on the phototransistor 222 and the light blocking film 224. The planarization layer 226 is configured on the color filter 225. The micro-lens 227 is configured on the planarization layer 226 and corresponds to the phototransistor 222.

The micro-lens 227 is configured to focus external light beams of the photoreceptor panel 20. The light beams may pass through the color filter 225, light beams with a color transformable (such as, tri-colored light, i.e., red-colored light, green-colored light, and blue-colored light) by the phototransistor 222 may be retained, and the light signals may be obtained. The light blocking film 224 is configured to block the light signals around the phototransistor 222. The light signals without being blocked may be transmitted to the phototransistor 222, and may be transformed into the electrical analog signals. The electrical analog signals may be transmitted to the GOA circuit 23 via the electrodes 223. The GOA circuit is configured to transform the electrical analog signals into the digital signals.

Specifically, the GOA circuit 23 includes an address decoder and an analog to digital (A/D) converter (not shown) electrically connected to the plurality of micro-lens units 22. The address decoder is configured to determine an address of the micro-lens unit where the electrical analog signals are transmitted, and to transmit the electrical analog signals to the A/D converter. The A/D converter is configured to transform the electrical analog signals into the digital signals. The plurality of micro-lens units 22 are arranged in an array, and each of the micro-lens units 22 has a row address and a column address. When a portion of the plurality of micro-lens units 22 receive the light signals and the light signals are transformed into the electrical analog signals, the address decoder is configured to determine the row address and the column address of the micro-lens units 22 which have received the light signals. The micro-lens units 22, which have received the light signals, may be selected, the received light signals of the micro-lens units 22 may be transform into the electrical analog signals, and the electrical analog signals may be transmitted to the A/D converter.

Figure 4:
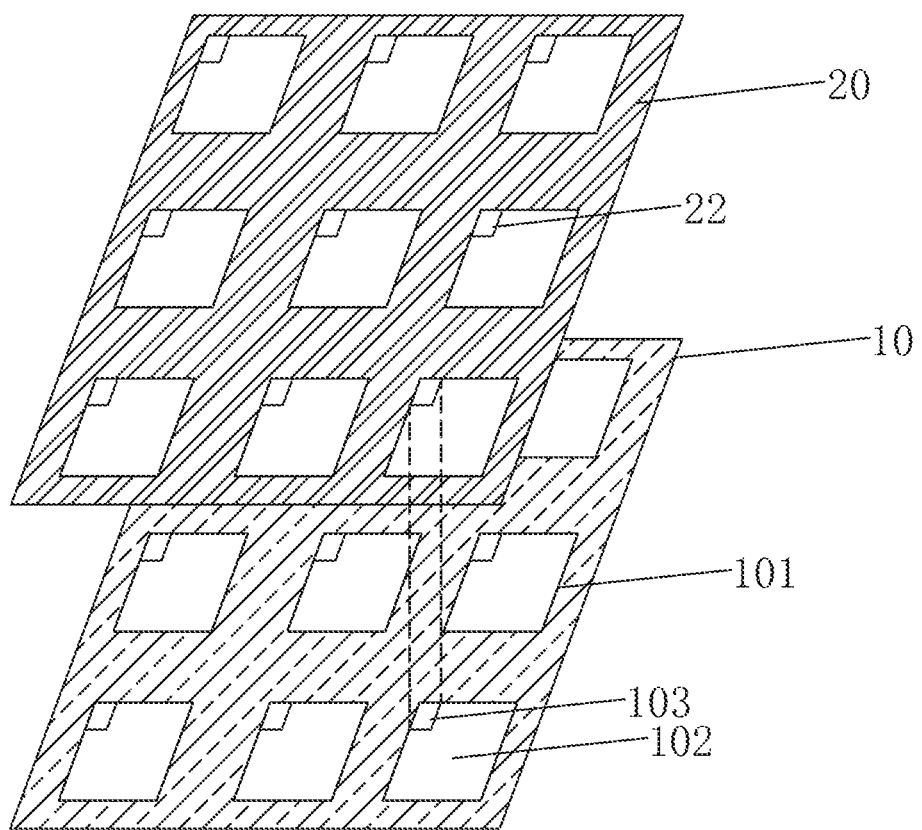
FIG. 4 is a diagram illustrating positions of the micro-lens unit of the full screen module and a display panel in accordance with one embodiment of the present disclosure.

Specifically, referring to FIG. 4, the display panel 10 includes a plurality of sub-pixels 101 arranged in an array, and each of the sub-pixels 101 corresponds to one micro-lens unit 22. Each of the sub-pixels 101 includes an emitting area 102 and a non-emitting area 103. The plurality of micro-lens units 22 are configured above the non-emitting area 103 (for example, the plurality of micro-lens units 22 are configured above a thin film transistor (TFT) of the non-emitting area 103, and a black array of the display panel 10 is configured to block the TFT and the micro-lens unit 22). As such, the photoreceptor panel 20 may not affect an aperture ratio of the display panel 10.

When the full screen module of the present disclosure is adopted by the smartphone, a maximum pixel value composed by the photoreceptor panel 20 is the same with a resolution of the smartphone. That is, the maximum pixel value composed by the plurality of micro-lens units 22 is the same with the resolution of the smartphone. A pixel operating area on the photoreceptor panel 20 may correspond to an application scenario of the smartphone. The GOA circuit 23 is configured to control the plurality of micro-lens units 22 within the pixel operating area, which correspond to the application scenario, to receive the light signals, and to control the plurality of micro-lens units 22 within a non-pixel operating area not to receive the light signals. As such, an efficiency of the photoreceptor panel 20 may be improved, and energy consumption may be reduced.

Figure 5:
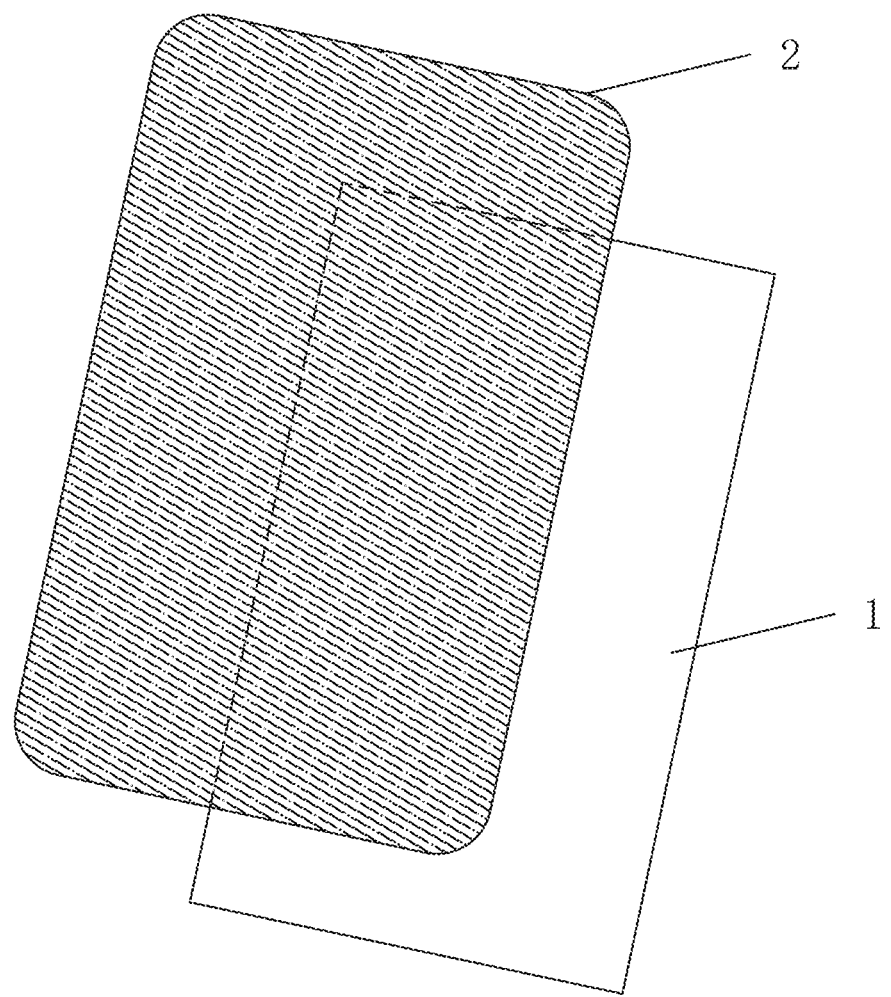
FIG. 5 is a diagram of a smartphone in accordance with one embodiment of the present disclosure.

Referring to FIG. 5, the present disclosure further relates to a smartphone, including a motherboard 1 and the full screen module 2 electrically connected to the motherboard 1.

It is noted that the photoreceptor panel 20 of the full screen module 2 is configured to capture the images locating in the front of the smartphone, to receive the light signals, to transform the light signals into the digital signals, and to transmit the digital signals to the driving chip 11. The driving chip 11 is configured to transform the digital signals into the data signals, and to drive the display panel 10 to display images. As such, the photoreceptor panel 20 may replace the front camera module of the conventional smartphone, and there is no need to have the special-shaped slot for accommodating the front camera module. As such, the screen ration may be configured to be nearly 100%.

Specifically, the motherboard 1 includes a processor (not shown) electrically connected to the full screen module 2. The processor is configured to receive the digital signals outputted from the driving chip 11 to provide image information to the display panel 10.

Specifically, the maximum pixel value composed by the photoreceptor panel 20 is the same with the resolution of the smartphone. That is, the maximum pixel value composed by the plurality of micro-lens units 22 is the same with the resolution of the smartphone. The pixel operating area on the photoreceptor panel 20 may correspond to the application scenario of the smartphone. The GOA circuit 23 is configured to control the plurality of micro-lens units 22 within the pixel operating area, which correspond to the application scenario, to receive the light signals, and to control the plurality of micro-lens units 22 within the non-pixel operating area not to receive the light signals. As such, the efficiency of the photoreceptor panel 20 may be improved, and the energy consumption may be reduced.

In view of the above, the full screen module of the present disclosure includes the display panel, the driving chip electrically connected to the display panel, the first flexible circuit board electrically connected to the driving chip, the photoreceptor panel configured on the display panel, and the second flexible circuit board electrically connected to the photoreceptor panel and the first flexible circuit board. The photoreceptor panel is configured to receive the light signals, to transform the light signals into the digital signals, and to transmit the digital signals to the driving chip. The driving chip is configured to transform the digital signals into the data signals, and to drive the display panel to display the images. When the full screen module is adopted by the smartphone, the photoreceptor panel may replace the front camera module of the conventional smartphone, and there is no need to have the special-shaped slot for accommodating the front camera module as the conventional display panel. As such, the screen ration of the smartphone may be improved by adopting the full screen module of the present disclosure. The smartphone of the present disclosure may include the full screen module. The photoreceptor panel of the full screen module may be able to replace the front camera module of the conventional smartphone. As such, the screen ratio may be improved.

Above are embodiments of the present invention, which does not limit the scope of the present invention. Any equivalent amendments within the spirit and principles of the embodiment described above should be covered by the protected scope of the invention.

What is claimed is:
1. A full screen module, comprising:
a display panel;
a driving chip being electrically connected to the display panel;
a first flexible circuit board being electrically connected to the driving chip;
a photoreceptor panel being configured on the display panel; and
a second flexible circuit board being electrically connected to the photoreceptor panel and the first flexible circuit board;
wherein the photoreceptor panel is configured to receive light signals, to transform the light signals into digital signals, and to transmit the digital signals to the driving chip;
the driving chip is configured to transform the digital signals into data signals, and to drive the display panel to display images;
wherein the display panel comprises a plurality of sub-pixels arranged in an array and the photoreceptor panel comprises a plurality of micro-lens units arranged in an array, such that the sub-pixels correspond, in a one-to-one manner, to the micro-lens units;
each of the plurality of sub-pixels comprises an emitting area and a non-emitting area, and one of the plurality of micro-lens units that corresponds to said each of the plurality of sub-pixels is arranged above the non-emitting area.
2. The full screen module according to claim 1, wherein the full screen module further comprises:

a polarizer being configured between the display panel and the photoreceptor panel; and a protection cover being configured on the photoreceptor panel.

3. The full screen module according to claim 1, wherein the photoreceptor panel comprises a gate driver on array (GOA) circuit electrically connected to the plurality of micro-lens units;

the plurality of micro-lens units are configured to receive the light signals, to transform the light signals into electrical analog signals, and to transmit the electrical analog signals to the GOA circuit;

the GOA circuit is configured to receive the electrical analog signals, to transform the electrical analog signals into the digital signals, and to transmit the digital signals to the driving chip.

4. The full screen module according to claim 3, wherein each of the micro-lens units comprises a substrate, a phototransistor, a plurality of electrodes, a light blocking film, a color filter, a planarization layer, and a micro-lens;

the phototransistor is configured on the substrate, the electrodes are configured on the substrate and respectively connect to two ends of the phototransistor, the light blocking film is configured on the electrodes, and the phototransistor is exposed by the light blocking film, the color filter is configured on the phototransistor and the light blocking film, the planarization layer is configured on the color filter, the micro-lens is configured on the planarization layer, and the micro-lens corresponds to the phototransistor;

the phototransistor is configured to transform the light signals into the electrical analog signals;

the electrode is configured to transmit the electrical analog signals to the GOA circuit.

5. The full screen module according to claim 4, wherein the GOA circuit comprises an address decoder and an analog to digital (A/D) converter being electrically connected to the plurality of micro-lens units;

the address decoder is configured to determine an address of the micro-lens unit where the electrical analog signals are transmitted, and to transmit the electrical analog signals to the A/D converter;

the A/D converter is configured to transform the electrical analog signals into the digital signals.

6. A smartphone, comprising:

a motherboard and the full screen module, as claimed in claim 1, being connected to the motherboard.

7. The smartphone according to claim 6, wherein the motherboard comprises a processor being electrically connected to the full screen module;

the processor is configured to receive the digital signals outputted from the driving chip to provide image information to the display panel.

8. The smartphone according to claim 6, wherein a maximum pixel value composed by a plurality of micro-lens units is the same with a resolution of the smartphone.

* * * * *